United States Patent [19]
Yarbrough et al.

[11] Patent Number: 5,051,623
[45] Date of Patent: Sep. 24, 1991

[54] TTL TRISTATE CIRCUIT FOR OUTPUT PULLDOWN TRANSISTOR

[75] Inventors: Roy L. Yarbrough, Hiram; Julio R. Estrada, South Portland, both of Me.

[73] Assignee: National Semiconductor Corporation, Santa Clara, Calif.

[21] Appl. No.: 537,903

[22] Filed: Jun. 16, 1990

[51] Int. Cl.$^5$ .................. H03K 19/02; H03K 19/088
[52] U.S. Cl. .................................. 307/473; 307/454; 307/456; 307/296.4; 307/263
[58] Field of Search .................. 307/443, 454–456, 307/473, 296.4, 263–264, 270

[56] References Cited

U.S. PATENT DOCUMENTS

| | | | |
|---|---|---|---|
| 4,398,103 | 8/1983 | Derzawiec et al. | 307/456 |
| 4,481,430 | 11/1984 | Houk et al. | 307/456 |
| 4,581,550 | 4/1986 | Ferris et al. | 307/473 |
| 4,649,297 | 3/1987 | Vazehgoo | 307/456 |
| 4,661,727 | 3/1987 | Ferris et al. | 307/443 |
| 4,667,320 | 6/1987 | Hannington | 307/475 |

OTHER PUBLICATIONS

IBM Tech. Disc. Bul., "Tri-State Read/Write Control Circuit" Marcella et al., vol. 24, No. 1B 6/81.

*Primary Examiner*—S. D. Miller
*Assistant Examiner*—Margaret Rose Wambach
*Attorney, Agent, or Firm*—Lee Patch; Daniel H. Kane

[57] ABSTRACT

The lower output pulldown tristate circuit for a TTL tristate output buffer circuit includes the enable signal invertor buffer having an $\overline{OE}$ signal input and an OE signal output providing output enable OE signals, and a Miller killer transistor element having collector and emitter nodes coupled between the base node of the TTL tristate output pulldown transistor and the low potential power rail. The base node of an emitter follower transistor element is coupled to the $\overline{OE}$ signal input and the emitter node provides a DC Miller killer DCMK signal output in phase with the $\overline{OE}$ signal input. A voltage divider couples the DCMK signal output to the base node of the Miller killer transistor element for discharging the base of the output pulldown transistor in response to a high potential DCMK signal during the high impedance tristate at the output. The DC Miller killer circuit is applied in a high speed TTL tristate output and multi-bit line driver. The emitter follower DCMK signal output and voltage divider coupling reduce DCMK signal generation delay, eliminate current hogging between Miller killer transistor elements of the multiple output buffers of a multi-bit output, and dispense with the ballast resistors which introduce delay.

11 Claims, 7 Drawing Sheets

TTL TRISTATE CIRCUIT FOR OUTPUT PULLDOWN TRANSISTOR

TECHNICAL FIELD

This invention relates to a new TTL tristate circuit, also known as a DC Miller killer circuit, for the lower output pulldown transistors of TTL tristate output buffers and devices useful in multi-bit line drivers. The invention provides improved TTL tristate output devices for multi-bit line drivers which avoid current hogging, reduce signal propagation times tpLZ and tpZL, and increase switching speed between the high impedance third state or tristate and a low potential level data signal at the output.

BACKGROUND ART

A conventional prior art inverting TTL tristate output device 10 is illustrated in FIG. 1. Data signals of high and low potential levels at the input $V_{IN}$ pass through an input circuit 12 including input transistor Q1 and a first stage of amplification provided by transistor element Q2 to the base of phase splitter transistor element QPS. Phase splitter QPS controls in opposite phase the conducting states of the pulldown transistor element QLOP and pullup transistor element provided by a Darlington transistor pair Q4 and Q5. The lower output pulldown transistor element QLOP sinks current from the output $V_{OUT}$ to low potential power rail GND. The pullup transistor Darlington Q4,Q5 sources current to the output $V_{OUT}$ from a high potential power rail $V_{CC}$. Tristate circuit or OE signal input circuit 16 establishes the high impedance third state or tristate at the output $V_{OUT}$.

Tristate circuit 16 includes an OE signal input and lines coupled to the respective base leads of the phase splitter QPS and pullup transistor Q5. Tristate circuit 16 therefore presents a high Z (impedance) at the output $V_{OUT}$ with a low potential level OE signal at the OE signal input.

Another tristate circuit 18 prevents current caused by voltage changes at the output $V_{OUT}$ feeding back through the internal Schottky diode clamp of pulldown transistor QLOP, from turning on QLOP during the high Z third state. This undesirable feedback current is referred to as "Miller current". A Miller killer transistor element QMK is coupled with collector and emitter nodes between the base lead of lower output pulldown transistor QLOP and the low potential power rail GND. Tristate circuit 18 includes a DCMK signal input coupled to the base of the Miller killer transistor element QMK through ballast resistor RB for turning on QMK when a high potential level DCMK signal appears at the DCMK signal input.

A high potential DCMK signal turns on the Miller killer transistor element QMK discharging the base of QLOP and any Miller current fed back to the base node of QLOP by fluctuations at the output $V_{OUT}$. The output $V_{OUT}$ may be tied to a common bus. A low potential DCMK signal turns off QMK and enables the normal bistate mode of operation of the output device.

The ballast resistor RB is intended to suppress current hogging between multiple QMK's coupled in parallel for multi-bit line drivers such as hex and octal line drivers incorporating multiple TTL tristate output buffers of the type illustrated in FIG. 1. The DCMK signal input may be coupled to multiple QMK's of the multiple output buffers through respective ballast resistors as hereafter described.

The DC Miller killer DCMK signal is out of phase with the OE signal and in phase with the complementary $\overline{OE}$ signal. The OE signal and DCMK signal are derived through double gate inversion as shown in FIG. 2. A first stage output enable OE inverting buffer circuit IB1 receives a complementary $\overline{OE}$ signal at an $\overline{OE}$ signal input and provides an OE signal output coupled to the OE signal input of tristate circuit 16. A second stage enable signal inverting buffer IB2 provides the DCMK signal output coupled to the DCMK signal input of tristate circuit 18. The DCMK signal output is in phase with the $\overline{OE}$ signal input and is coupled to the base node of QMK through ballast resistor RB.

In the Farhad Vazehgoo U.S. Pat. No. 4,649,297 issued Mar. 10, 1987, a prior art TTL tristate output device similar to FIG. 1 herein is illustrated in FIG. 5 of that patent. In the Vazehgoo FIG. 5 circuit the output enable OE signal is designated "E" and the complementary DCMK signal is designated "A". In FIG. 6 of U.S. Pat. No. 4,649,297, Vazehgoo suggests deriving the DCMK or "A" signal from an emitter follower transistor element coupled directly to the $\overline{OE}$ or "E" signal input circuit for avoiding the double inversion coupling sequence and accompanying signal propagation delay. However, Vazehgoo does not address the current hogging problem of multiple Miller killer transistor elements QMK encountered in multi-bit line drivers with multiple TTL tristate output devices coupled in parallel. Nor does he suggest how such a circuit to avoid QMK current hogging might be configured and implemented in this context. The problem of QMK current hogging in TTL tristate output multi-bit line drivers is summarized as follows.

A prior art circuit for TTL tristate output multi-bit line drivers such as hex or octal line drivers is illustrated in FIG. 3. A separate output buffer of the type illustrated in FIG. 1 is provided for each output bit of the multi-bit line driver. A fragmentary portion of these multiple output buffers is shown in FIG. 3 including the data bit outputs BIT0...BITn, pulldown transistor elements QLOP0...QLOPn, and ballast resistors RB0...RBn.

OE and DCMK signals for all of the multiple output buffers are generated by enable inverting buffer stages IB1 and IB2 as in FIG. 2. The DCMK signal output from IB2 is coupled in parallel to the respective ballast resistors RB0...RBn for Miller killer transistor elements QMK0...QMKn. The ballast resistors RB0...RBn are intended to reduce current hogging between the respective QMK's for effective discharge of base current from the respective QLOP's of the different bit output buffers. A fragmentary portion of the output circuit of IB2 shows the coupling of the output of IB2 between IB2 pulldown transistor QA and pullup resistor RA to the ballast resistors RB0...RBn.

Further description of prior art DC Miller killer circuits can be found in the Ferris et al. U.S. Pat. No. 4,581,550 issued Apr. 8, 1986; the Ferris U.S. Pat. No. 4,311,927 issued Jan. 19, 1982; and the Hannington U.S. Pat. No. 4,677,320 issued June 30, 1987.

One disadvantage of prior art lower output pulldown tristate circuits or DC Miller killer circuits noted above is that two inverting stages, IB1 and IB2, are conventionally used to generate the DCMK signal introducing tristate switching delays for the tpZL and tpLZ transitions. The propagation times or switching times for switching between a high Z tristate signal and a low potential data signal at the output are designated tpZL and tpLZ.

A further disadvantage is that for multi-bit line driver applications, the ballast resistors do not effectively prevent current hogging between the multiple QMK's. Where the QMK's are required to sink differing collector currents for discharging the bases of the respective QLOP's, current hogging may prevent a QMK from sinking a larger required collector current. The ballast resistors may also have large resistance, further slowing the switching speed of the QMK's.

OBJECTS OF THE INVENTION

It is therefore an object of the present invention to provide a new DC Miller killer circuit which eliminates the two stage delay in generating the DCMK signal for actuating Miller killer transistor elements.

Another object of the invention is to provide a new lower output pulldown tristate circuit which avoids the problem of current hogging between Miller killer transistor elements in TTL tristate output multi-bit line driver applications. According to the invention the speed of operation is further enhanced by eliminating the requirement for ballast resistors.

A further object of the invention is to provide a new high speed TTL tristate output multi-bit line driver incorporating the new DC Miller killer tristate circuit.

DISCLOSURE OF THE INVENTION

In order to accomplish these results the invention provides a new DC Miller killer circuit for TTL tristate output devices having a data signal output for transmitting data signals at high and low potential levels, a pulldown transistor element coupled to the data signal output for sinking current from the output to a low potential power rail, and an enable signal input circuit for receiving an 0E signal and for establishing a high Z third state at the data signal output. An OE inverting buffer circuit has an $\overline{OE}$ signal input circuit for receiving a complementary $\overline{OE}$ signal, and an OE signal output providing the OE signal for coupling to the enable signal input circuits of the TTL tristate output devices.

According to the invention, the base node of an emitter follower transistor element is coupled to the $\overline{OE}$ signal input circuit. The emitter node of the emitter follower transistor element forms the DCMK signal output providing a DCMK signal in phase with the $\overline{OE}$ signal. Miller killer transistor elements are coupled in parallel with collector and emitter nodes between the base nodes of the respective output pulldown transistor elements of the plurality of output devices of a multi-bit line driver, and low a potential power rail. Voltage divider circuits couple the DCMK signal output to the respective base nodes of the Miller killer transistor elements for causing a low Z path to the low potential power rail through the Miller killer transistor elements during the high Z third state at the output.

In the preferred embodiment of the invention, each voltage divider circuit is formed by first and second resistors coupled in series between the emitter follower transistor element emitter node and the low potential power rail. A common node between the first and second resistors is coupled to the base node of the respective Miller killer transistor element. The resistance value of the second resistor, coupled between the Miller killer transistor element base node and the low potential power rail is greater than the resistance value of the first resistor coupled between the emitter follower transistor element emitter node and base node of the Miller killer transistor element.

A feature of this arrangement is that the resistance value of the second resistor may be selected to be greater than the resistance value of the first resistor by a specified amount to establish the desired voltage levels and provide the required base drive current to the respective Miller killer transistor elements for discharging the bases of the respective output pulldown transistor elements. An advantage of the emitter follower transistor element configuration in the DC Miller killer circuit is that it can effectively provide unlimited base drive current to the respective Miller killer transistor elements eliminating current hogging in multi-bit line driver applications. Elimination of the large ballast resistors improves signal propagation time and switching speed.

Another advantage of the invention is that the emitter follower transistor element providing the DCMK signal output is coupled to the $\overline{OE}$ signal input circuit of the first stage enable inverter buffer. The second stage enable invertor buffer is eliminated along with the accompanying tristate signal propagation delay.

The emitter follower transistor element DCMK signal output and voltage divider circuits effectively can provide base drive current "overdrive" for fast switching of the Miller killer transistor elements. In the preferred embodiment each Miller killer transistor element is a Schottky transistor, and excess base drive current can pass through the internal Schottky diode clamp to the collector of the Miller killer transistor element for sinking through the emitter to the low potential power rail.

The DC Miller killer circuit of the invention is applied in TTL tristate output multi-bit line drivers with parallel coupling of the DCMK signal output. The DCMK signal output is coupled through parallel resistor dividers to the respective Miller killer transistor elements of multiple output buffers. Other objects, features and advantages of the invention are set forth in the following specification and accompanying drawings.

DESCRIPTION OF PREFERRED EXAMPLE EMBODIMENTS AND BEST MODE OF THE INVENTION

Figure 1:
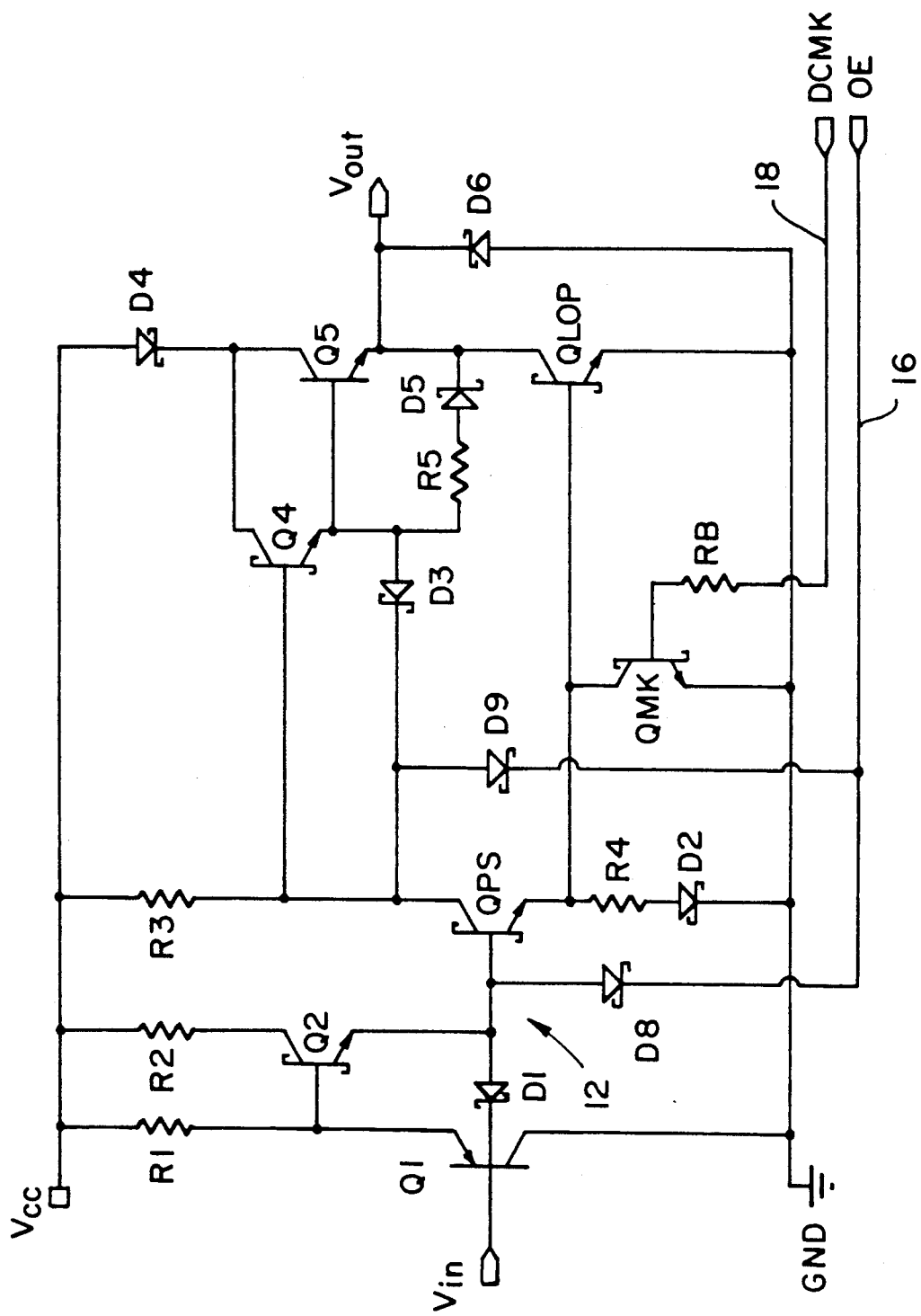
FIG. 1 is a schematic circuit diagram of a prior art TTL tristate output device with a lower output pulldown transistor (QLOP) tristate circuit.
Figure 4:
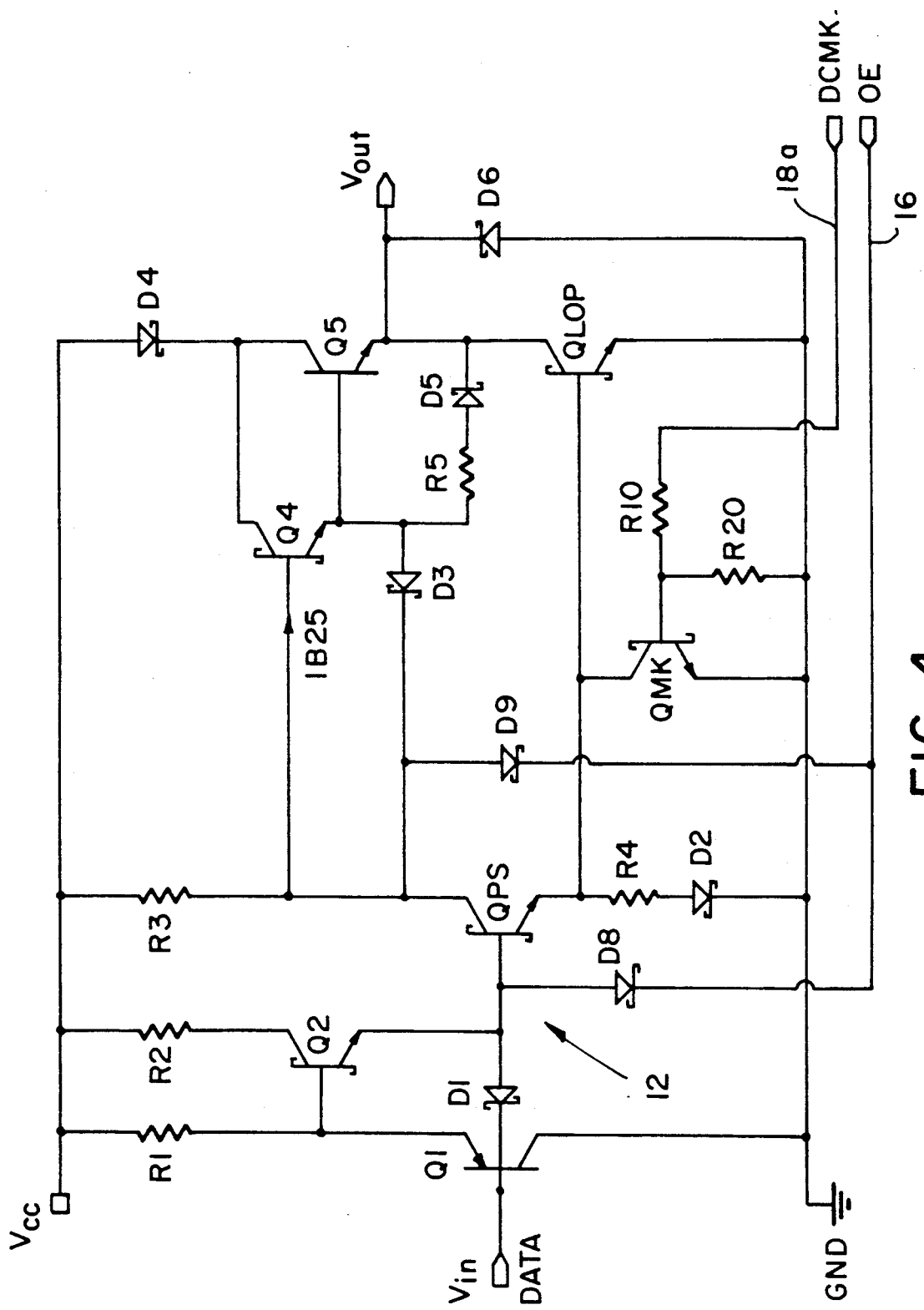
FIG. 4 is a schematic circuit diagram of a TTL tristate output device according to the invention.

A TTL tristate output device according to the present invention is illustrated in FIG. 4. Circuit components performing the same function as the components of the circuit of FIG. 1 are indicated by the same reference designations. The TTL tristate output buffer circuit of FIG. 4 differs from the circuit of FIG. 1 at the coupling of the DCMK signal to the Miller killer transistor element QMK. The DCMK signal input is coupled to the base node of QMK through a voltage divider provided by resistors R10 and R20. The different coupling using voltage divider R10, R20 is occasioned by the different character of the DCMK signal generated by the DCMK signal generating circuitry according to the invention.

The OE and DCMK signal generating circuitry is similar to the enable signal inverter buffer IB1 modified as hereafter described with reference to FIG. 5. The invertor buffer includes the complementary $\overline{OE}$ signal input, an OE input circuit including input transistor element QPNP, and a first stage of amplification for the $\overline{OE}$ input signal provided by transistor QB. The amplified signal is applied at the base node of phase splitter transistor QC which controls in opposite phase the conducting states of the pulldown transistor element QD and the pullup Darlington transistor pair Q10,Q11. A complementary $\overline{OE}$ signal at the $\overline{OE}$ signal input is therefore inverted and produces a 0E signal at the OE signal output.

According to the invention the second inverter, buffer stage IB2 is eliminated and the DCMK signal is generated by an emitter follower transistor element QEF having a base node coupled to the $\overline{OE}$ input circuit of the first stage invertor buffer similar to IB1. The base node of the emitter follower transistor element QEF is coupled to an internal node of the $\overline{OE}$ input circuit rather than directly to the $\overline{OE}$ signal input so that QEF is isolated from variations on the input bus. The emitter node of emitter follower transistor QEF provides the DCMK signal output as illustrated in FIG. 5. Because the DCMK signal output is now the output of an emitter follower transistor element, the DCMK signal of FIG. 5 has a different character from the DCMK signal of FIG. 2. In particular, as hereafter described the emitter follower QEF provides a low impedance DCMK signal source for supplying all of the base drive current demands for multiple Miller killer transistor elements in multi-bit line driver applications.

Figure 5:
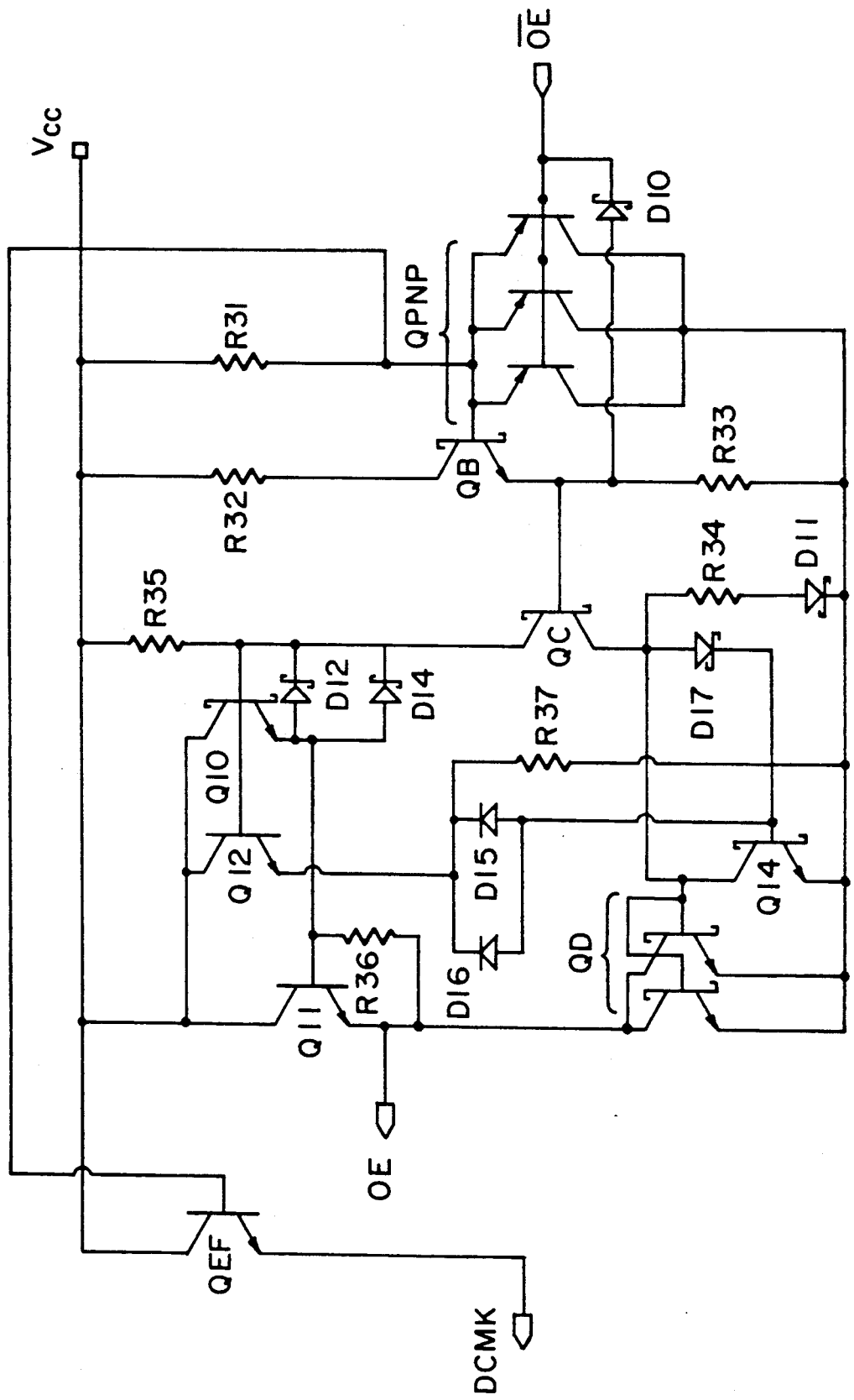
FIG. 5 is a detailed schematic circuit diagram of the OE and DCMK signal generating circuitry according to the invention coupled to the TTL tristate output device of FIG. 4.

Additional optional features of the OE and DCMK signal generating circuit of FIG. 5 include an AC Miller killer circuit provided by components Q12, D15, D16, Q14, R7, and D17. The AC Miller killer circuit discharges Miller current from the base node of pulldown transistor QD during low to high (LH) potential level data signal transitions at the output in the bistate mode of operation.

Figure 6:
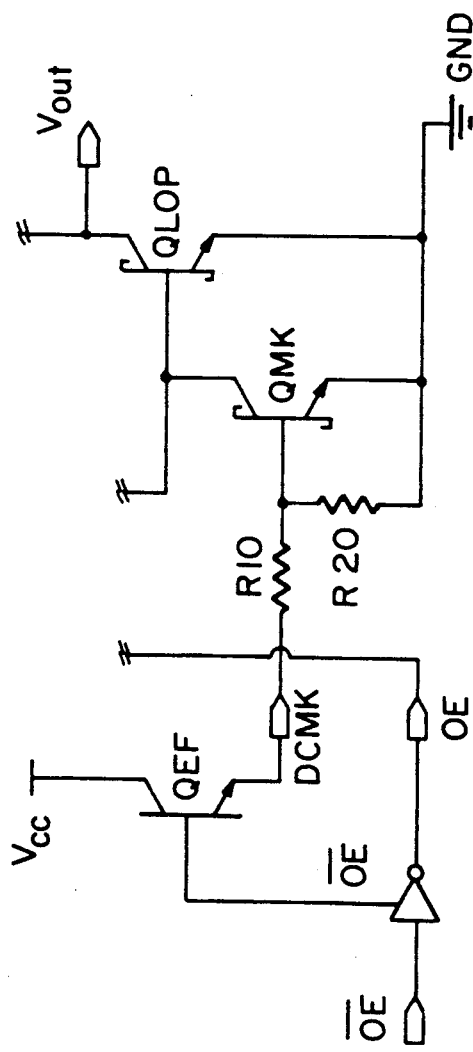
FIG. 6 is a simplified circuit diagram of the lower output pulldown tristate circuit o DC Miller killer circuit according to the invention.

The lower output pulldown tristate circuit of FIGS. 4 and 5 is summarized in FIG. 6. As there shown, the second enable inverter stage IB2 is eliminated and the single enable inverter stage similar to IB1 provides both the 0E signal output and the DCMK signal output through emitter follower transistor QEF. Importantly, the DCMK signal output is in turn coupled to the base node of the Miller killer transistor QMK through the voltage divider circuit provided by resistors R10 and R20.

Figure 7:
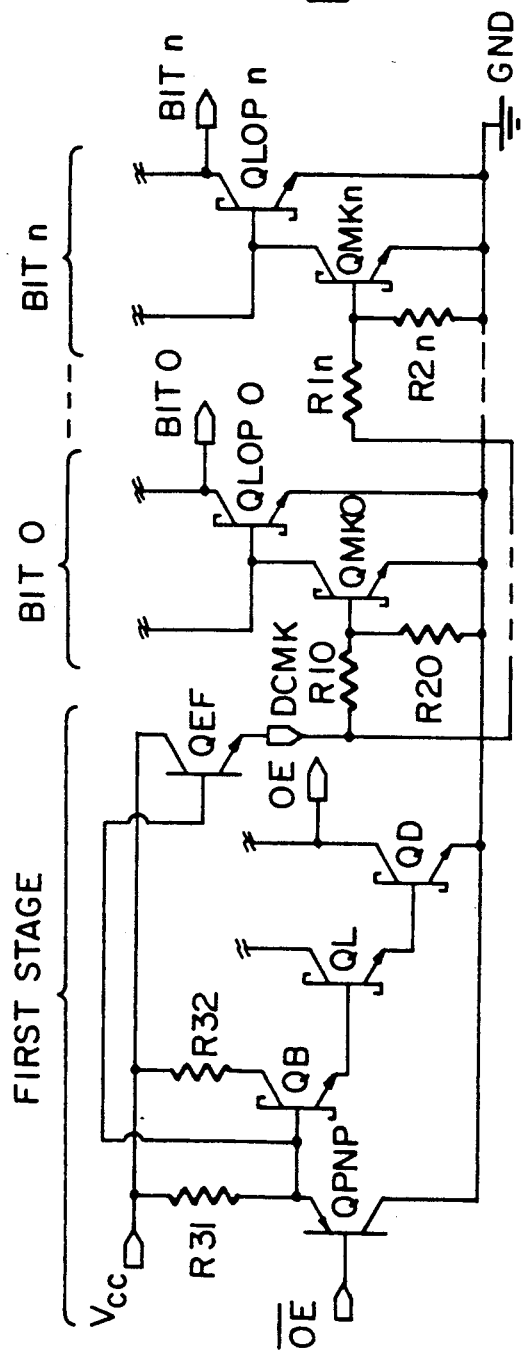
FIG. 7 is a fragmentary schematic circuit diagram of a TTL tristate output multi-bit line driver according to the invention.
Figure 8:
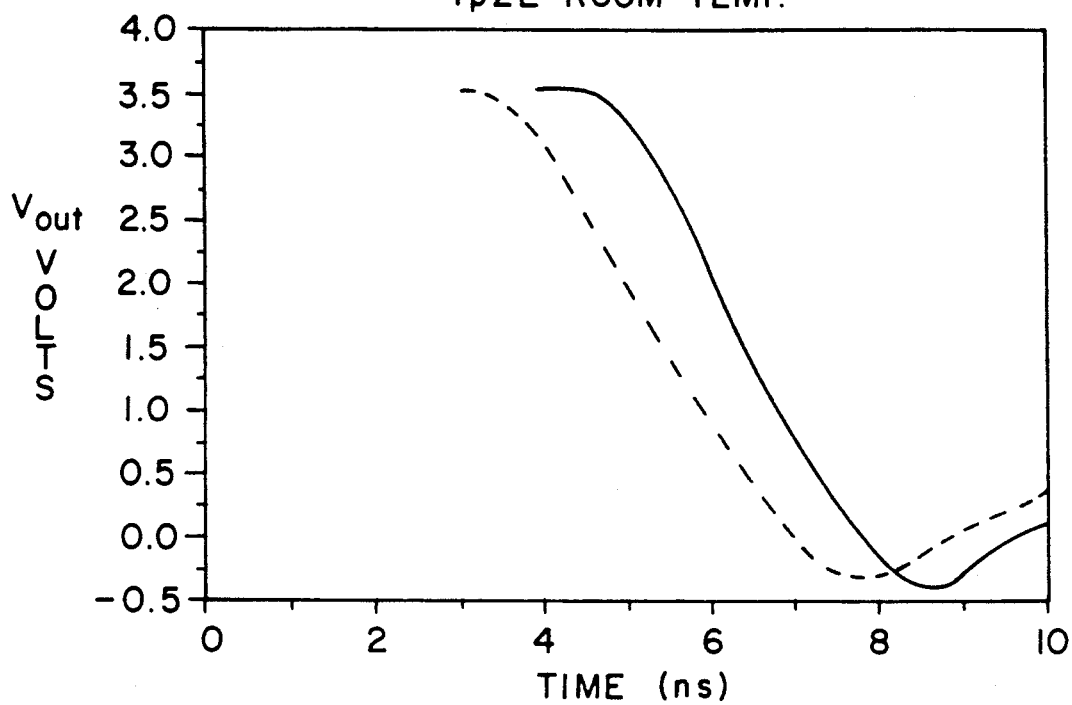
FIGS. 8–11 are graphs showing the reduced signal propagation times tpLZ and tpZL and increased switching speed for the tristate circuit of FIGS. 4 and 5 in comparison with the tristate circuit of FIGS. 1 and 2.
Figure 9:
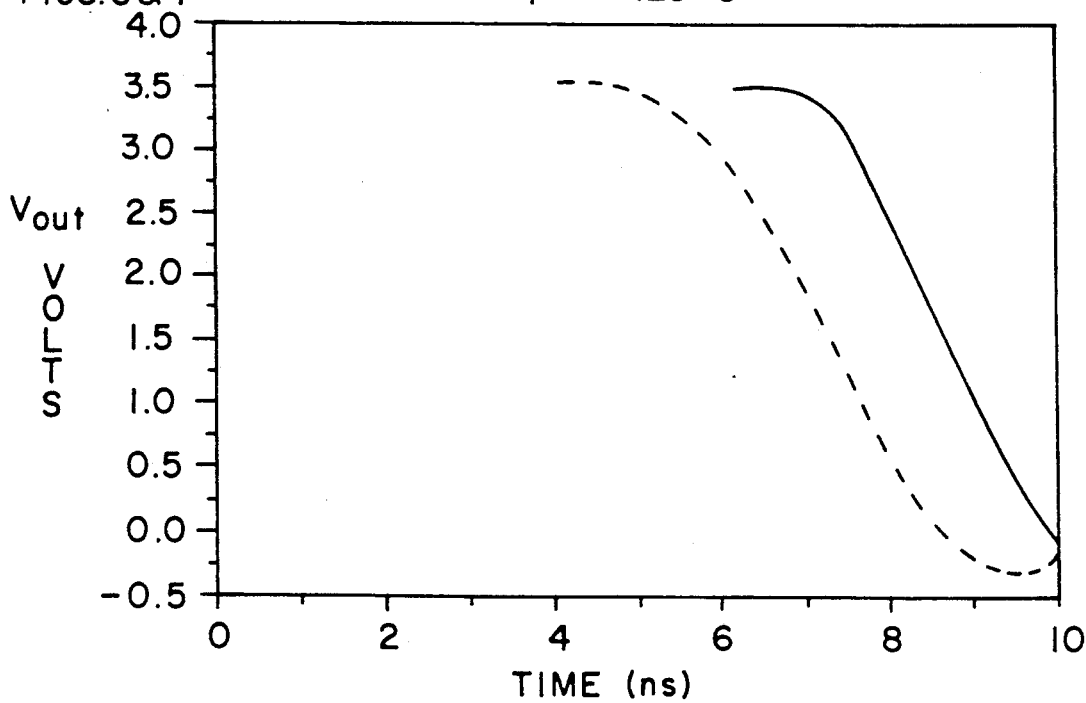
Figure 10:
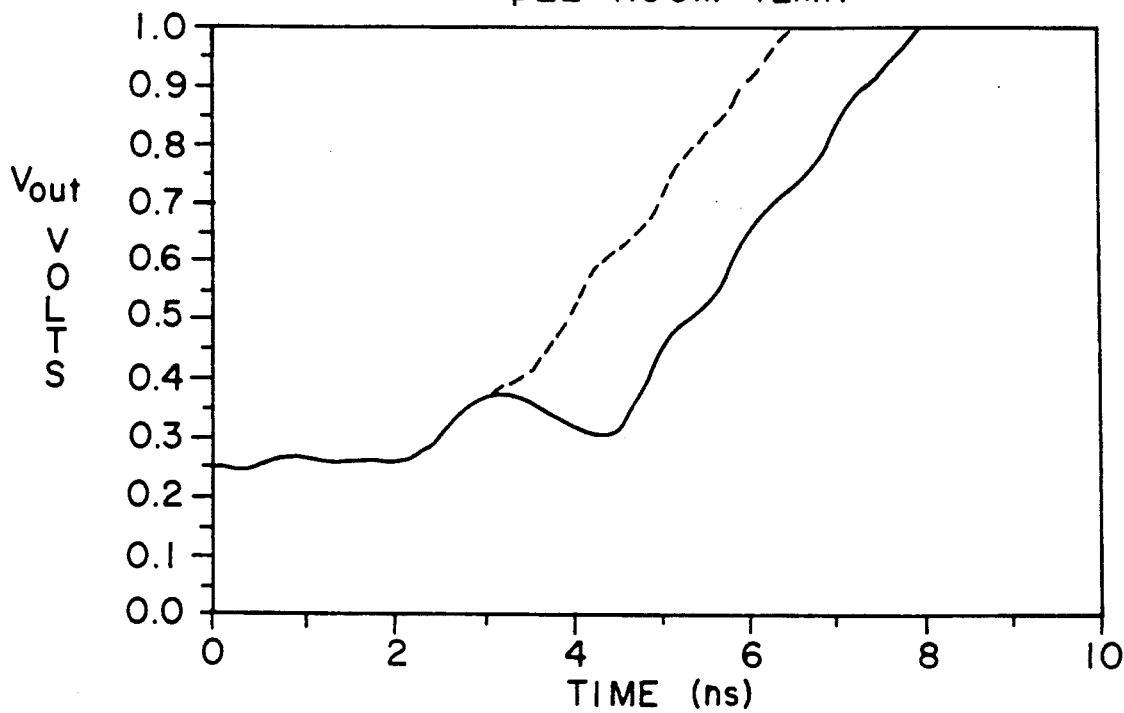
Figure 11:
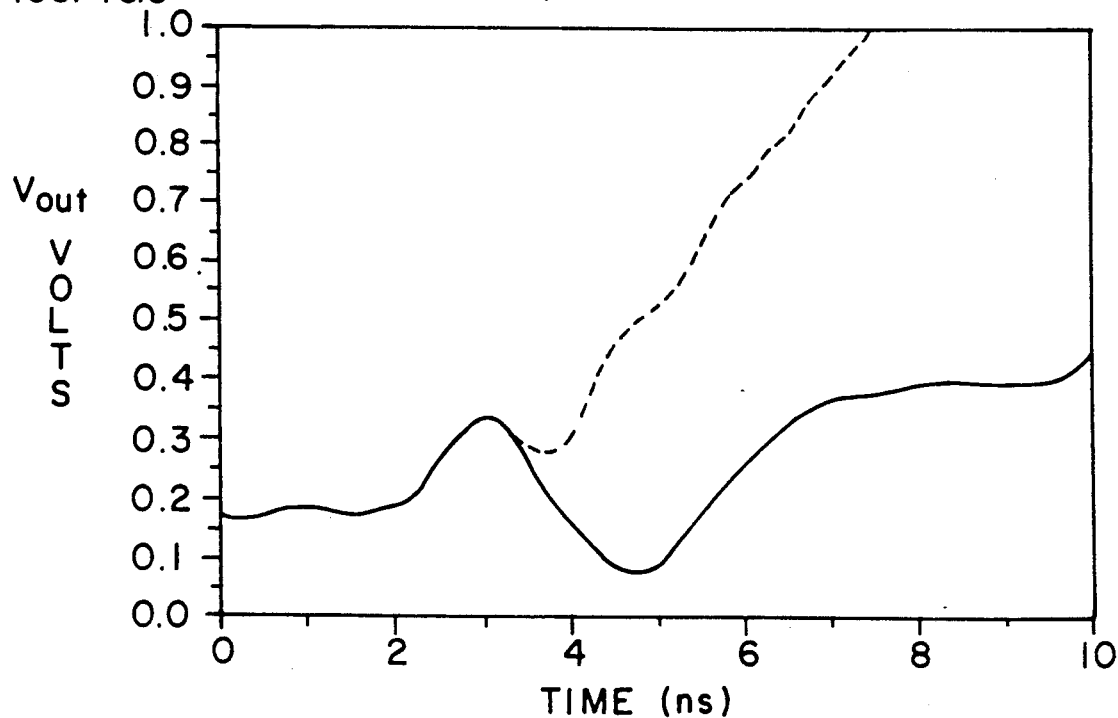

For multi-bit line driver applications, the TTL tristate output circuit configuration is illustrated in FIG. 7. The first stage enable invertor buffer similar to IB1 is represented by transistor elements QPNP, QB, QC and QD. The $\overline{OE}$ signal input through input transistor element QPNP generates an inverted OE signal at the collector node of pulldown transistor element QD. At the same time the $\overline{OE}$ signal input circuit is coupled to drive the base node of emitter follower transistor element QEF whose emitter node provides the DCMK signal output.

The DCMK signal output is now coupled in parallel to multiple tristate output buffers, one for each of the respective bits of the multi-bit line driver. The DCMK signal output is thus coupled in parallel to multiple resistor divider circuits R10/R20...R1n/R2n in turn coupled to the respective base nodes of Miller killer transistors QMK0...QMKN of the TTL tristate buffers for BIT0---BITn.

Emitter follower transistor element QEF supplies all of the base drive demand of each of the Miller killer transistors QMK0...QMKn without the dilemma of current hogging. With a high potential level $\overline{OE}$ signal at the $\overline{OE}$ signal input and with invertor buffer transistor elements QB,QC and QD conducting, a voltage level of $3\phi(3V_{be})$ is applied at the base node of emitter follower transistor QEF. A low potential level OE signal of for example 1 $V_{SAT}$ appears at the OE signal output at the collector of pulldown transistor QD. A DCMK high potential level signal of $2\phi$ ($2V_{BE}$) is applied in parallel at the emitter node of transistor QEF across resistors R10...R1n of the parallel voltage divider circuits and the respective base emitter junctions of the Miller killer transistors QMK0...QMKn. With a $1V_{BE}$ or $1\phi$ voltage drop across the base emitter junction of each of the QMK's, the voltage drop across the respective resistors R10...Rn of the voltage divider circuits is therefore also approximately $1\phi$. A voltage of $1\phi$ is left at the base nodes of the respective Miller killer transistor elements QMK0...QMKn, sufficient to turn on the QMK's for discharging the bases of the respective output pulldown transistors QLOP0...QLOPn.

The base drive current available at the base node of each of the respective QMK's depends on the selection of the resistor divider resistors R10/R20...R1n/R2n. For example for BIT0, the closer to equality are the resistance values R10 and R20, the smaller the difference in current through the two resistors and the smaller the difference current available for base drive current at the base of transistor QMK0. The greater the difference, the greater the available base drive current. The resistance values of resistors R10 and R20 and the resistance values of other voltage divider resistor pairs R1n and R2n are selected to give the desired base drive current for the amplification $\beta$ of the QMK resistors in order to achieve the desired collector current for discharging the bases of the respective QLOP's.

In the example of FIG. 7 all of the first resistors R10...R1n have equal resistance at a first resistance value and all of the second resistors R20...R2n have equal resistance at a second resistance value. The second resistance value of the second resistors R20...R2n is greater than the first resistance value of the first resistors R10...R1n. Less current therefore flows through the second resistor R20...R2n leaving base drive for the respective Miller killer transistor QMK0...QMKn. Both resistors, however, are relatively small in comparison with prior art ballast resistors. With a voltage of $3V_{be}$ at the base node of transistor QEF and a voltage of $1V_{be}$ at the base nodes of the Miller killer transistors QMK0...QMKn, the QMK's become conducting discharging the bases of the respective lower output pulldown transistors QLOP0...QLOPn maintaining the high impedance third state at the bit output nodes BIT0...BITn.

By way of example resistor R10 and each of the first resistors R1n may be selected to have a resistance value of for example 2K ohms while the resistance value of R20 and the second resistors R2n is selected to be 2.2K ohms. With a voltage drop of approximately $1V_{be}(1\phi)$ equal to approximately 0.8 volts across each resistor, the current $I_{R1}$ through resistor R1 is approximately 0.4 mA while the current $I_{R2}$ through resistor R2 is approximately 0.36 mA. The base drive current $I_b$ through transistor QMK is therefore 0.04 mA or 40 uA. Initially the collector current $I_c$ QMK is equal to the base drive current $I_b$ QMK multiplied by the amplification factor $\beta$ of transistor QMK. Given the $\beta$ amplification factor of the respective Miller killer transistors QMK and the desired collector current for discharging the respective bases of the lower output pulldown transistors QLOP, the base drive current for the QMK's can be set by the voltage dividers establishing the necessary voltage at the base nodes of the QMK's for sinking the requisite collector currents.

When the complementary $\overline{OE}$ input signal at the $\overline{OE}$ signal input is at the low potential level, the base node of emitter follower transistor element QEF will also be substantially at the same low potential level turning off the QMK's. The output pulldown transistors QLOP0...QLOPn are therefore enabled for operation in the bistate data signal transmitting mode.

Figure 2:
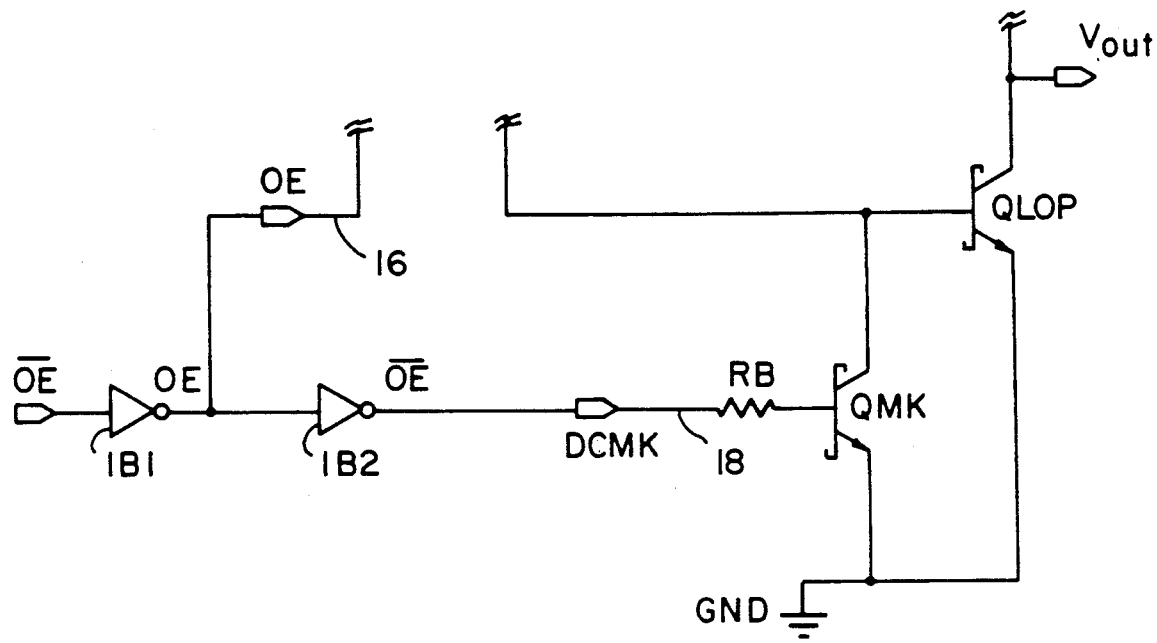
FIG. 2 is a simplified circuit diagram of the prior art OE and DCMK signal generating circuitry coupled to the TTL tristate output device of FIG. 1.
Figure 3:
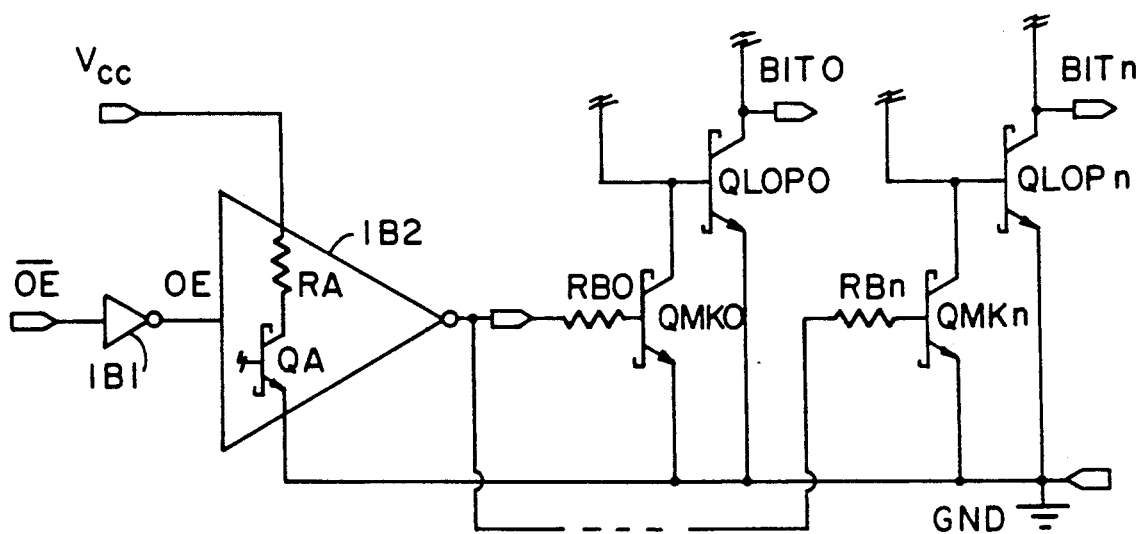
FIG. 3 is a fragmentary schematic circuit diagram of a prior art TTL tristate output multi-bit line driver.

The advantage of the circuits of FIGS. 4 and 5 over the prior art circuits of FIGS. 1 and 2 is apparent in the graphs of FIGS. 8-11. Graphs 8-11 show the relationship of the output voltage $V_{OUT}$ of the respective TTL tristate output buffer circuits for the transitions tpZL and tpLZ at room temperature and at 125° C. These graphs document the substantial reduction in tristate signal propagation time and enhanced switching speed during transitions between the high Z tristate and low potential data signal level at the output.

While the invention has been described with reference to particular example embodiments it is intended to cover all modifications and equivalents within the scope of the following claims.

We claim:

1. A DC Miller killer circuit for a TTL tristate output device having a data signal output ($V_{OUT}$) for transmitting data signals at high and low potential levels, a pulldown transistor element (QLOP) coupled to the data signal output for sinking current from the output to a low potential power rail, and an enable signal input circuit for receiving an OE signal and for establishing a high impedance third state at the data signal output comprising:

an $\overline{OE}$ signal input circuit for receiving an $\overline{OE}$ signal;

an emitter follower transistor element (QEF) having a base node coupled to the $\overline{OE}$ signal input circuit and an emitter node forming a DCMK signal output providing a DCMK signal in phase with the $\overline{OE}$ signal;

a Miller killer transistor element (QMK) having collector and emitter nodes coupled between a base node of the pulldown transistor element (QLOP) and the low potential power rail;

an a voltage divider circuit comprising first and second voltage drop components (R10,R20), separate from the Miller killer transistor element (QMK), coupled in series between the emitter follower transistor element (QEF) and the low potential power rail, with a common node between the first and second voltage drop components coupled to a base node of the Miller killer transistor element, said second voltage drop component (R20) having a voltage drop parameter value greater than a corresponding voltage drop parameter value of the first voltage drop component (R10) by a specified amount to provide required base drive current to the Miller killer transistor element (QMK) during the high impedance third state.

2. The DC Miller killer circuit of claim 1 wherein the voltage divider circuit comprises first and second resistors (R10,R20) coupled in series between the emitter follower transistor element (QEF) emitter node and the low potential power rail with a common node between the resistors coupled to the base node of the Miller killer transistor element (QMK).

3. The DC Miller killer circuit of claim 2 wherein the resistance of the second resistor (R20) coupled between the Miller killer transistor element base node and the low potential power rail is greater than the resistance of the first resistor (R10) coupled between the emitter follower transistor element emitter node and base node of the Miller killer transistor element by a specified amount to provide required base drive current to the Miller killer transistor element for discharging the base of the pulldown transistor element during the high impedance third state.

4. The DC Miller killer circuit of claim 3 wherein the Miller killer transistor element is a Schottky transistor element.

5. A TTL tristate output device having an input for receiving input data signals at high and low potential levels and a data signal output ($V_{OUT}$) for transmitting data signals, a pulldown transistor element (QLOP) for sinking current from the data signal output to a low potential power rail, pullup means for sourcing current to the data signal output from a high potential power rail, phase splitter transistor element coupled to control the conducting state of the pulldown transistor element in response to input data signals, an OE input circuit for receiving an OE signal and for establishing a high impedance third state at the data signal output, an $\overline{OE}$ signal input circuit for receiving an $\overline{OE}$ signal, and a Miller killer transistor element (QMK) having collector and emitter nodes coupled between a base node of the pulldown transistor element (QLOP) and the low potential power rail, the improvement comprising:

an emitter follower transistor element (QEF) having a collector node coupled to the high potential power rail, base node coupled to the $\overline{OE}$ signal input circuit, and an emitter node providing a DCMK signal output for delivering a DCMK signal in phase with an $\overline{OE}$ signal at the $\overline{OE}$ signal input circuit;

and a voltage divider circuit comprising first and second resistors coupled in series between the emitter follower transistor element (QEF) emitter node and the low potential power rail with a common node between the resistors coupled to a base node of the Miller killer transistor element (QMK), the resistance of the second resistor (R20) being greater than the resistance of the first resistor (R10) by a specified amount to provide required base drive current to the Miller killer transistor element (QMK) for turning on the Miller killer transistor element and discharging a base of the pulldown transistor element (QLOP) during the high impedance third state.

6. The DC Miller killer circuit of claim 5 wherein the Miller killer transistor element is a Schottky transistor element.

7. A TTL tristate output multi-bit line driver (FIG. 7) having a plurality of TTL tristate output devices as set forth in claim 5.

8. A TTL tristate output multi-bit line driver having a plurality of data bit output buffers each having a data bit output for transmitting data bit signals at high and low potential levels, each data bit output buffer having a pulldown transistor element (QLOPn) for sinking current from the respective data bit output to a low potential power rail and a phase splitter transistor element for controlling the conducting state of the pulldown transistor element, said data bit output buffers each having a Miller killer transistor element (QMKn) with collector and emitter nodes coupled between the base node of the respective pulldown transistor element (QLOPn) and the low potential power rail, each data bit output buffer having an OE input circuit for establishing a high Z third state at the respective data bit output in response to an $\overline{OE}$ signal, said TTL tristate output multi-bit line driver having an $\overline{OE}$ signal input circuit for receiving an $\overline{OE}$ signal comprising:

emitter follower transistor means (QEF) having a base node coupled to the $\overline{OE}$ signal input circuit and an emitter node providing a DCMK signal output in phase with the $\overline{OE}$ signal;

and a plurality of voltage divider circuits coupled in parallel to the DCMK signal output, each voltage divider circuit comprising first and second voltage drop components (R1n,R2n), separate from the respective Miller killer transistor element (QMKn), coupled in series between the emitter node of the emitter follower transistor element (QEF) and the low potential power rail, with a common node between the first and second voltage drop components coupled to a base node of the Miller killer transistor element, said second voltage drop component (R2n) having a voltage drop parameter value greater than a corresponding voltage drop parameter value of the first voltage drop component (R1n) by a specified amount to provide required base drive current to the Miller killer transistor element (QMKn) during the high impedance third state.

9. The TTL tristate output multi-bit lane driver of 8 wherein each voltage divider circuit comprises first and second resistors (R1n, R2n) coupled in series between the emitter follower transistor element (QEF) emitter node and the low potential power rail with a common node between the resistors coupled to the base node of the Miller killer transistor element (QMKn).

10. The TTL tristate output multi-bit line driver of claim 9 wherein the resistance of the second resistor (R2n) coupled between the Miller killer transistor element base node and the low potential power rail is greater than the resistance of the first resistor (R1n) coupled between the emitter follower transistor element emitter node and base node of the Miller killer transistor element by a specified amount to provide required base drive current to the Miller killer transistor element (QMKn) for discharging a base of the respective pulldown transistor element (QLOPn).

11. The DC Miller killer circuit of claim 10 wherein the Miller killer transistor element is a Schottky transistor element.

* * * * *